(12) United States Patent
Dani

(10) Patent No.: US 11,336,237 B2
(45) Date of Patent: May 17, 2022

(54) VECTOR MODULATOR FOR MILLIMETER WAVE APPLICATIONS

(71) Applicant: Metawave Corporation, Palo Alto, CA (US)

(72) Inventor: Asmita Dani, San Jose, CA (US)

(*) Notice: Subject to any disclaimer, the term of this patent is extended or adjusted under 35 U.S.C. 154(b) by 76 days.

(21) Appl. No.: 16/575,207

(22) Filed: Sep. 18, 2019

(65) Prior Publication Data

US 2020/0099350 A1 Mar. 26, 2020

Related U.S. Application Data

(60) Provisional application No. 62/735,550, filed on Sep. 24, 2018.

(51) Int. Cl.
| | | |
|---|---|---|
| *H03F 1/02* | (2006.01) | |
| *H03F 3/19* | (2006.01) | |
| *H03F 3/21* | (2006.01) | |
| *H03G 3/30* | (2006.01) | |
| *H03F 3/193* | (2006.01) | |
| *H04B 1/04* | (2006.01) | |
| *H03F 3/213* | (2006.01) | |

(52) U.S. Cl.
CPC ........... *H03F 3/193* (2013.01); *H03F 1/0294* (2013.01); *H03F 3/213* (2013.01); *H03G 3/3036* (2013.01); *H04B 1/0483* (2013.01); *H04B 2001/0408* (2013.01)

(58) Field of Classification Search
CPC ........ H03F 3/193; H03F 1/0294; H03F 3/213; H03F 2200/204; H03F 2200/192; H03F 2200/451; H03F 3/195; H03F 3/245; H03F 3/602; H03G 3/3036; H03G 1/0017; H03G 3/3042; H04B 1/0483; H04B 2001/0408; H01P 5/222
USPC ................... 330/124 R, 295, 84, 286, 53–54
See application file for complete search history.

(56) References Cited

U.S. PATENT DOCUMENTS

| | | | |
|---|---|---|---|
| 6,492,949 B1 | 12/2002 | Breglia et al. | |
| 7,756,491 B2* | 7/2010 | Kee | ........................ H03F 1/3282 455/114.3 |
| 8,452,251 B2* | 5/2013 | Saunders | ............. H01Q 15/242 455/307 |

(Continued)

OTHER PUBLICATIONS

P. James, "The RF Modelling of a Ku-band Multi-port Amplifier," esa Airbus Defence and Space, UK, pp. 1-8.

(Continued)

*Primary Examiner* — Hieu P Nguyen
(74) *Attorney, Agent, or Firm* — Sandra Lynn Godsey

(57) ABSTRACT

Examples disclosed herein relate to a vector modulator architecture, having an input splitter network configured to receive a radio frequency (RF) input signal and generate a plurality of quadrature signals at different phases, a variable gain amplifier (VGA) stage coupled to the input splitter network and configured to apply a first gain to one or more of the plurality of quadrature signals, a power combiner coupled to the VGA stage and configured to combine the plurality of quadrature signals into a combined RF signal, and a power amplifier (PA) stage coupled to the power combiner and configured to apply a second gain to the combined RF signal and generate an output RF signal. Other examples disclosed herein relate to an antenna system for autonomous vehicles and a radar system for use in an autonomous driving vehicle.

19 Claims, 16 Drawing Sheets

(56) References Cited

U.S. PATENT DOCUMENTS

| | | | |
|---|---|---|---|
| 8,922,347 | B1 | 12/2014 | de Rochemont |
| 9,236,892 | B2 | 1/2016 | Dupuy et al. |
| 9,905,928 | B2 | 2/2018 | de Rochemont |
| 10,367,463 | B2 * | 7/2019 | Dascher ............... H03F 3/605 |
| 2011/0175789 | A1 | 7/2011 | Lee et al. |
| 2014/0347234 | A1 | 11/2014 | Caloz et al. |
| 2016/0134022 | A1 | 5/2016 | Alexopoulos et al. |

OTHER PUBLICATIONS

Mohamed Elkhouly et al., "220-250-GHz Phased-Array Circuits in 0.13-um SiGe BiCMOS Technology" IEEE Transactions on Microwave Theory and Techniques, vol. 61, No. 8, pp. 3115-3127, Aug. 2013.

P. James et al., "Design of a Multiport Amplifier Beam Forming Network for a Mobile Communications Antenna," EADS Astrium, UK Roke Manor Research Ltd., Romsey, pp. 1-12.

A. Babakhani et al.,"Transmitter Architectures Based on Near-Field Direct Antenna Modulation," in IEEE Journal of Solid-State Circuits, vol. 43, No. 12, pp. 2674-2692, Dec. 2008.

E.A. Firouzjaei, "mm-Wave Phase Shifters and Switches," Technical Report No. UCB/EECS-2010-163, Electrical Engineering and Computer Sciences, University of California at Berkeley, Berkeley, CA, USA, Dec. 2010.

A. S. Tehrani, H. M. Nemati, H. Cao, T. Eriksson and C. Fager, "Dynamic load modulation of high power amplifiers with varactor-based matching networks," 2009 IEEE MTT-S International Microwave Symposium Digest, pp. 1537-1540. 2009.

F. Raab, et al., "Power Amplifiers and Transmitters for RF and Microwave," IEEE Transactions on Microwave Theory and Techniques, vol. 50, No. 3, pp. 814-826, 2002.

* cited by examiner

700

VECTOR MODULATOR FOR MILLIMETER WAVE APPLICATIONS

CROSS-REFERENCE TO RELATED APPLICATIONS

This application claims priority from U.S. Provisional Application No. 62/735,550, titled "VECTOR MODULATOR FOR USE IN MILLIMETER WAVE APPLICATIONS," filed on Sep. 24, 2018, of which is incorporated by reference herein.

BACKGROUND

Millimeter wave applications have emerged to address the need for higher bandwidth and higher data rates. The millimeter wave spectrum covers frequencies between 30 and 300 GHz and can reach data rates of 10 Gbits/s or more with wavelengths in the 1 to 10 mm range. The smaller wavelengths have distinct advantages, including better resolution and accuracy that are critical in wireless communications and autonomous driving applications. The shorter the wavelength, however, the shorter the transmission range for a given power. At the power levels desired in wireless communications and autonomous driving applications, this limitation means higher free space and atmospheric loss which can be mitigated with good receiver sensitivity, high transmit power and high antenna gains.

In many of these applications, power amplifiers ("PAs") are needed to achieve the required power. Designing millimeter wave PAs is challenging as losses must be minimized while achieving the desired power with miniaturized millimeter wave circuits. The PAs are often used as components in radio frequency integrated circuits ("RFICs"), which come with their own design challenges to achieve their ambitious goals. Millimeter wave PAs are used in vector modulators, for example, to provide controllable phase shifts that are desirable in both wireless and autonomous driving applications. Achieving high gains with minimum loss across a full 360° phase range in vector modulators is of particular importance.

BRIEF DESCRIPTION OF THE DRAWINGS

The present application may be more fully appreciated in connection with the following detailed description taken in conjunction with the accompanying drawings, which may not be drawn to scale and in which like reference characters refer to like parts throughout, and wherein.

DETAILED DESCRIPTION

A vector modulator for use in millimeter wave ("mm-wave") applications is disclosed. The vector modulator architecture is suitable for many different mm-wave applications and can be deployed in a variety of different environments and configurations. Mm-wave applications are those operating with frequencies between 30 and 300 GHz or a portion thereof, including autonomous driving applications in the 77 GHz range and 5G applications in the 60 GHz range, among others. In various examples, the vector modulator is incorporated in a radar in an autonomous driving vehicle having an analog beamforming antenna. The analog beamforming antenna is capable of steering multiple beams across a full 360° Field of View ("FoV").

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced using one or more implementations. In one or more instances, structures and components are shown in block diagram form in order to avoid obscuring the concepts of the subject technology. In other instances, well-known methods and structures may not be described in detail to avoid unnecessarily obscuring the description of the examples. Also, the examples may be used in combination with each other.

Figure 1:
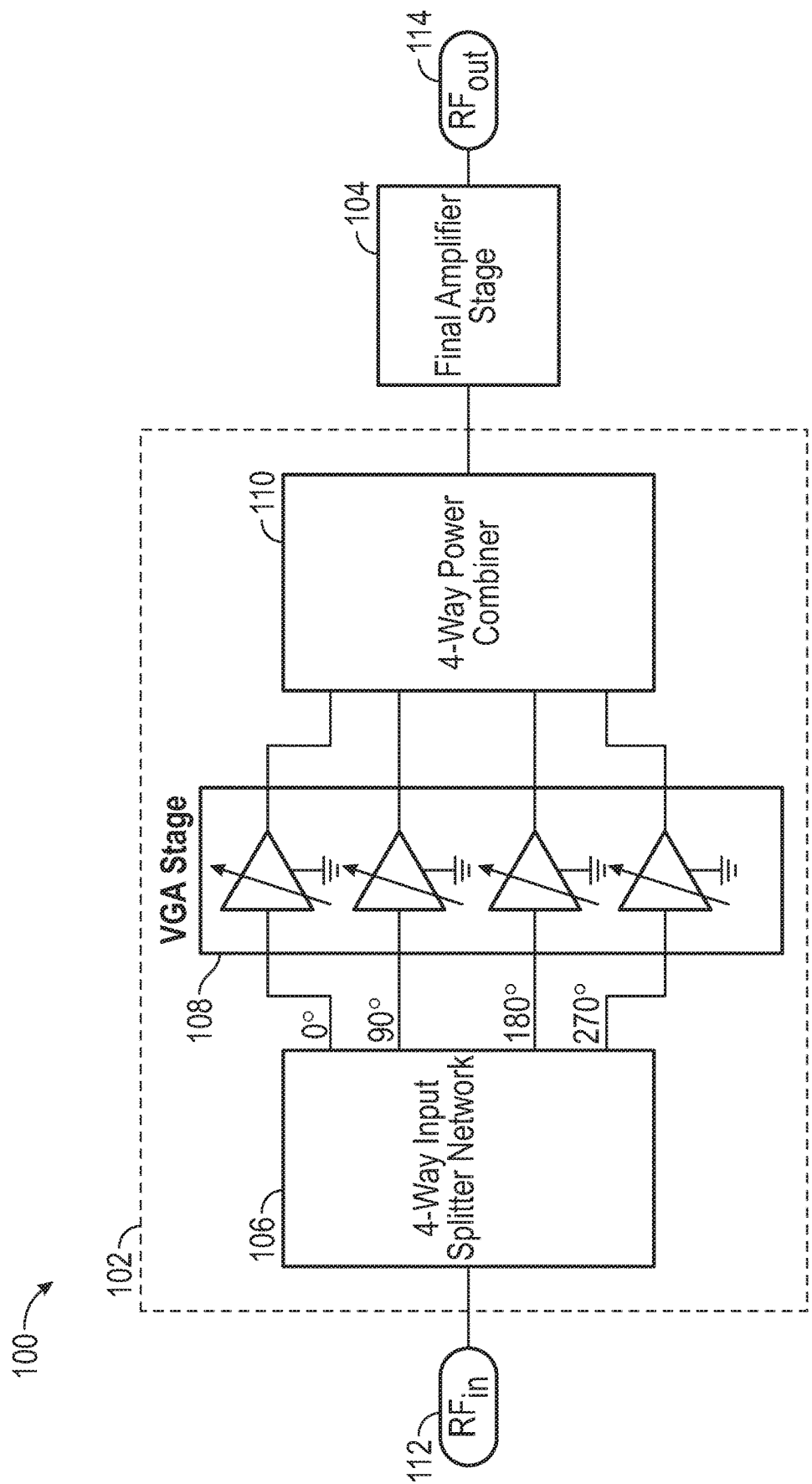
FIG. 1 illustrates a vector modulator architecture for use in millimeter wave applications in accordance with various examples.

FIG. 1 illustrates a vector modulator architecture for use in millimeter wave applications in accordance with various examples. Vector modulator architecture 100 has a vector modulator 102 coupled to a final amplifier state 104. The vector modulator 102 provides a 360° phase shift and ensures unconditionally stable amplification in mm-wave frequencies with three main circuit structures: (1) a 4-way input splitter network 106 to generate four quadrature RF signals at 0°, 90°, 180° and 270° from an input radio frequency ("RF") signal 112; (2) a variable gain amplifier ("VGA") stage 108 with 4 VGAs to provide unconditionally stable amplification gain for each quadrature RF signal; and (3) a 4-way power combiner 110 to combine the amplified quadrature RF signals into a single output port. The combined signal is further amplified at the final amplifier stage 104, which provides an RF output signal 114 with a total gain of around 20-25 dB at mm-wave frequencies of interest in the 76 to 82 GHz range. In various examples, the vector modulator architecture 100 is built on a 60 nm Gallium Nitride ("GaN") on Silicon ("Si") wafer. Each of the circuit structures 104-110 is described in more detail hereinbelow.

Figure 2:
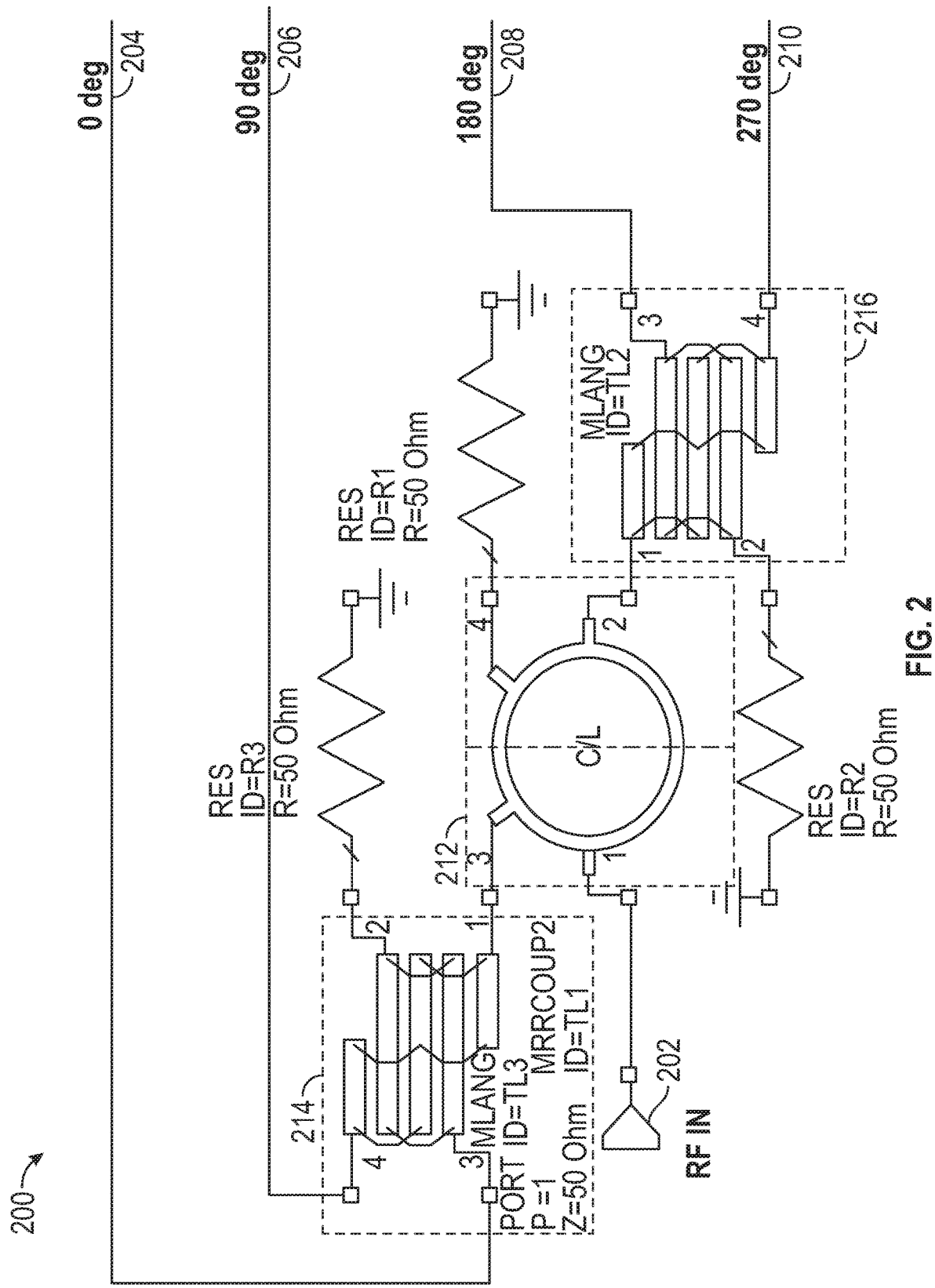
FIG. 2 is a schematic diagram of a 4-way input splitter network implemented as in FIG. 1 in accordance with various examples.

FIG. 2 is a schematic diagram of an example 4-way input splitter network implemented as in FIG. 1. Splitter network 200 takes in an RF input signal 202 and provides four quadrature signals 204-210 at 0°, 90°, 180° and 270° phases, respectively. The splitter network 200 has a rat-race coupler 212 connected to two Lange couplers 214-216. Rat-race coupler 212, also known as a hybrid ring coupler, has four ports that are placed one quarter wavelength away from each other at a 3 dB coupling loss. The RF signal 202 is input into port labeled '1' and split into two 180° out of phase signals between ports '2' and '3', while port '4' is isolated. The two split signals are input into the two Lange couplers 214-216, with the signal in port '2' input into the Lange coupler 216 and the signal in port '3' input into the Lange coupler 214. Each Lange coupler then acts as a quadrature hybrid coupler with two output lines at a 90° phase difference to produce the four quadrature signals 204-210.

Figure 3:
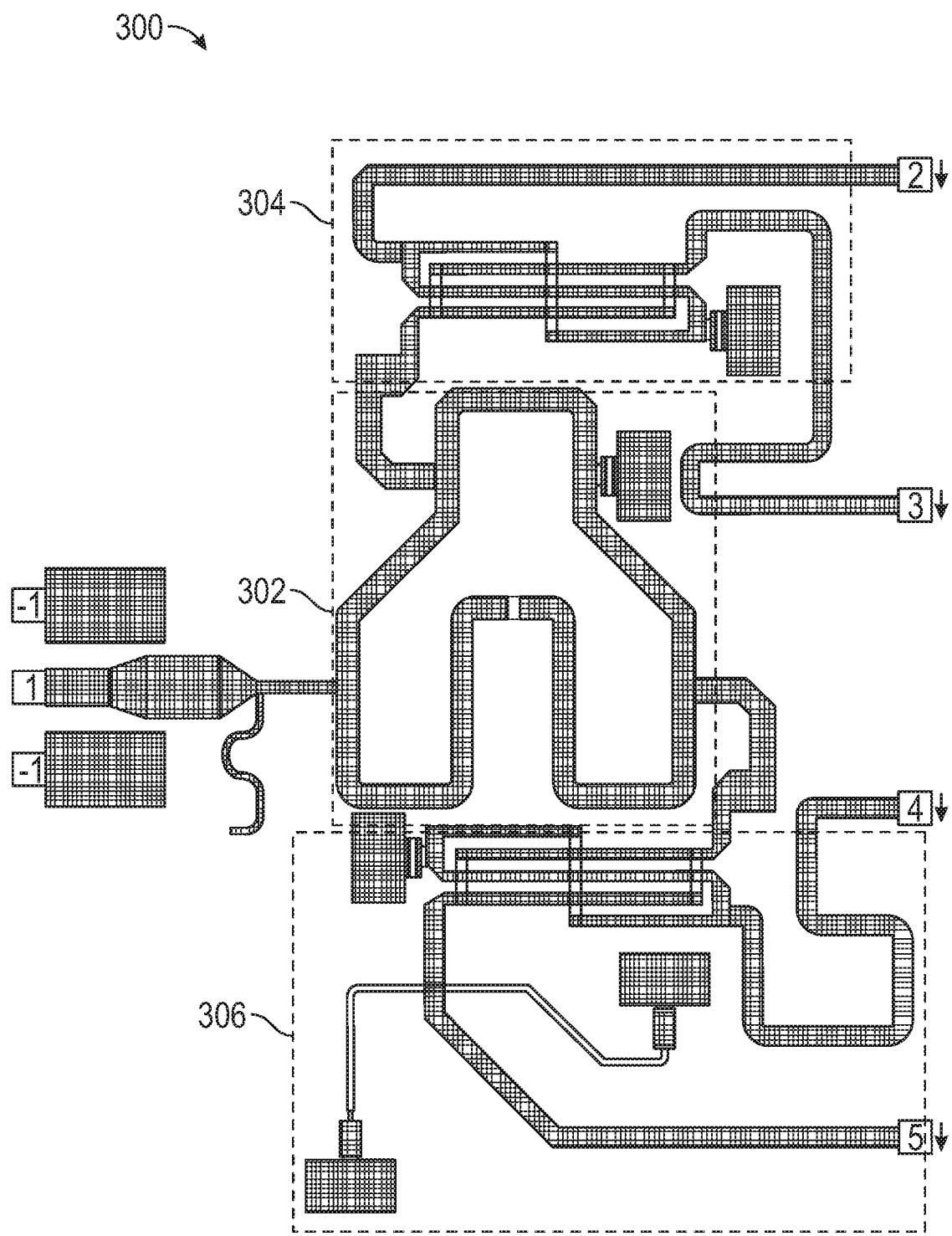
FIG. 3 shows an example layout for a 4-way input splitter network implemented as in FIG. 2.
Figure 4:
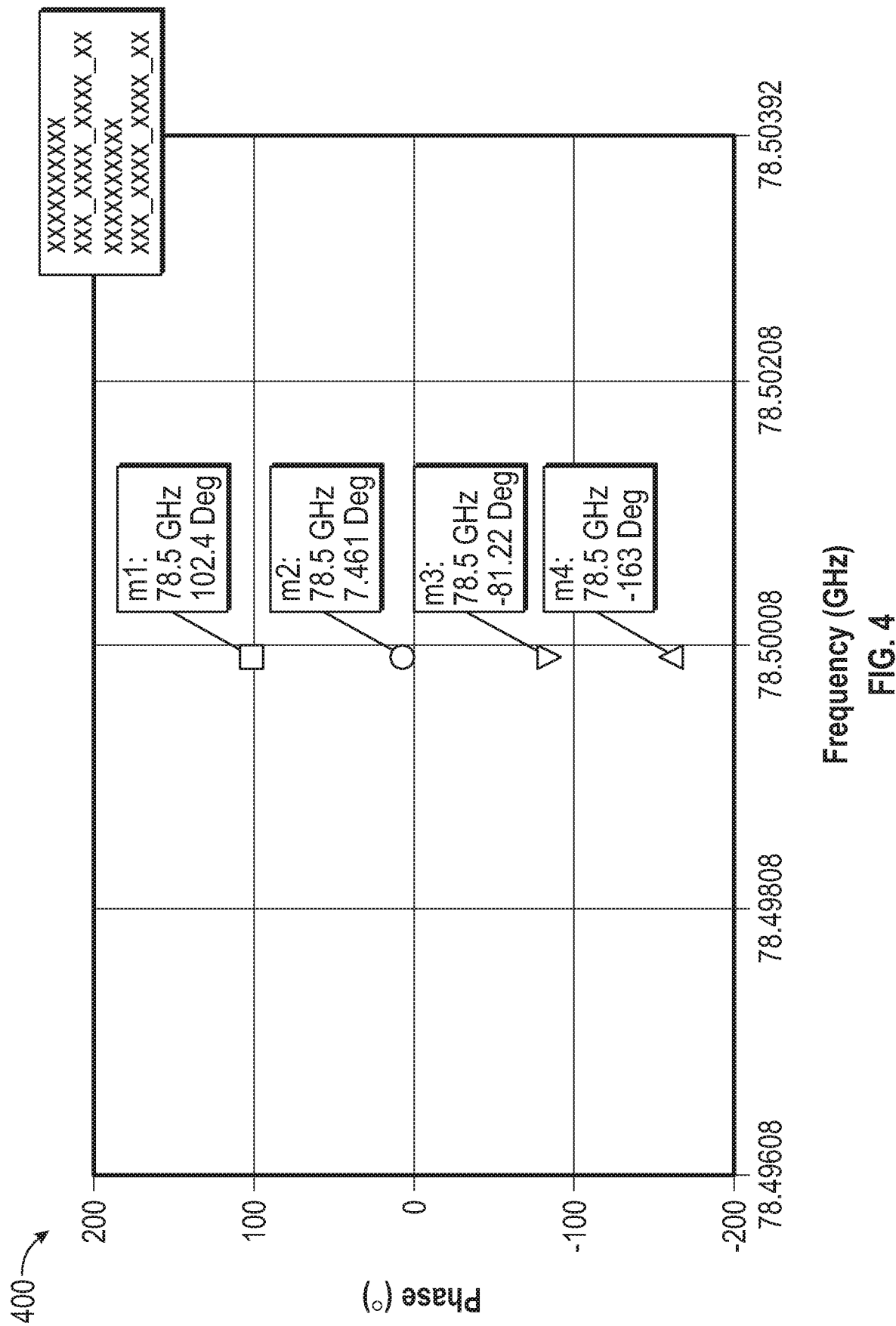
FIG. 4 is a graph illustrating the phase of quadrature signals generated by a 4-way input splitter network implemented as in FIG. 2.

FIG. 3 shows an example layout for a 4-way input splitter network implemented as in FIG. 2. Layout 300 has a rat-race coupler 302 connected to Lange couplers 304-306. Rat-race coupler 302 is designed as in rat-race coupler 212 of FIG. 2, and Lange couplers 304-306 are designed as in Lange couplers 214-216 of FIG. 2. A graph illustrating the phase of the quadrature signals generated by a 4-way input splitter network implemented as in FIG. 2 and with a layout as in FIG. 3 is shown in FIG. 4. Graph 400 illustrates the phases of four quadrature signals at 78.5 GHz, confirming that the 4-way input splitter of FIGS. 2 and 3 operates at mm-wave frequencies to achieve desired phase shifts across a 360° range.

Figure 5:
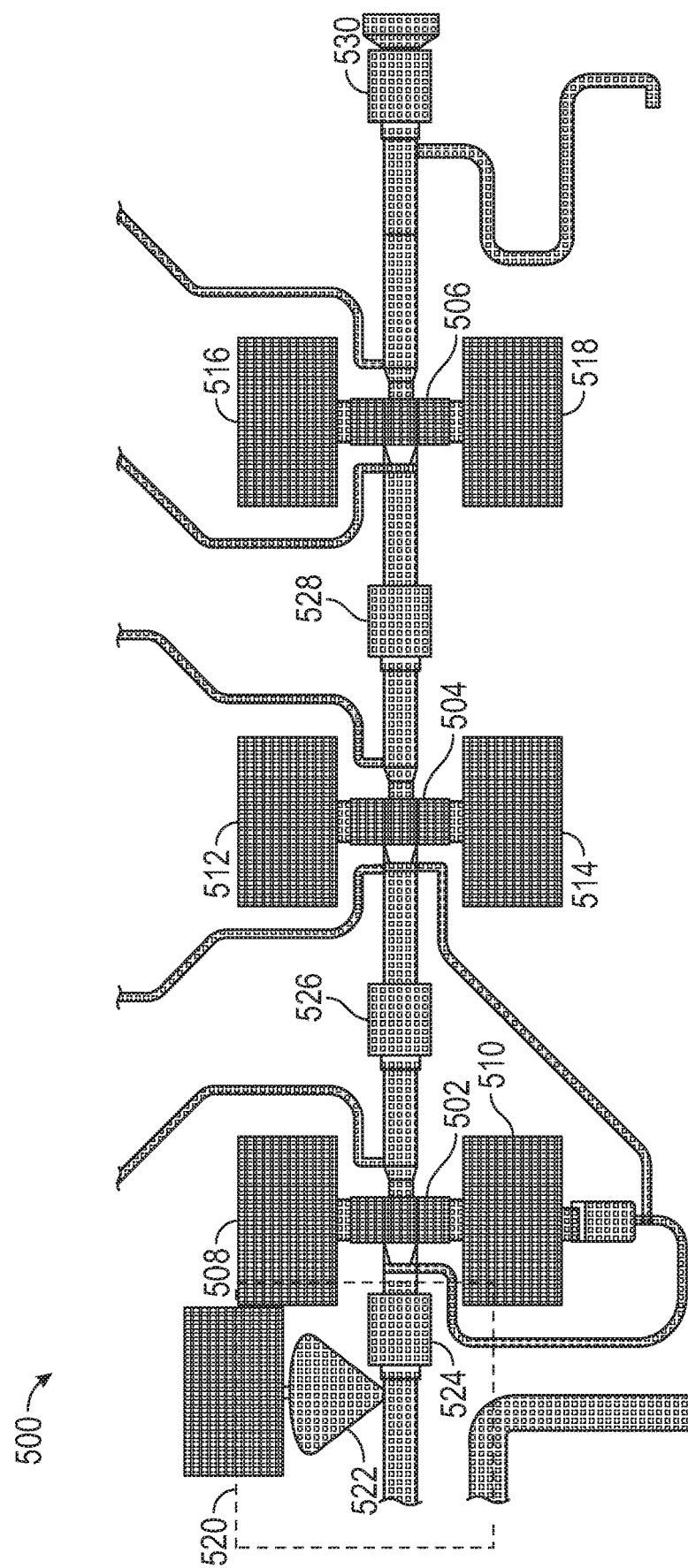
FIG. 5 is a schematic diagram of a 3-stage, unconditionally stable VGA for use in a vector modulator implemented as in FIG. 1 in accordance with various examples.

Attention is now directed to FIG. 5, which shows a schematic diagram of a 3-stage, unconditionally stable VGA for use in a vector modulator implemented as in FIG. 1 in accordance with various examples. VGA 500 is a single VGA that can be implemented into one of the four VGAs in VGA stage 108 of FIG. 1. In various examples, VGA 500 is a 3-stage VGA implemented with 3 PAs 502-506 that are designed with 2×30 μm GaN pseudomorphic-High-Electron-Mobility-Transistors ("pHEMTs"). Each PA has a gain of around 6 dB and is connected to a set of vias, such as vias 508-510 for PA 502, vias 512-514 for PA 504, and vias 516-518 for PA 506.

The PAs 502-506 are made unconditionally stable with the integration of stability network 520. Stability network 520 has a transmission line and a radial stub 522 for impedance conjugate matching and to avoid instability issues. Stability network 520 also has a DC blocking capacitor 524 to filter out low frequencies and further improve stability. The combination of a transmission line, DC blocking capacitor 524 and radial stub 522 is effectively a high pass matching network topology. This matching network topology provides unconditional stability by filtering out DC and lower RF frequencies by selecting appropriate capacitance values for the DC blocking capacitor 524 and dimensions for the radial stub 522. Note that DC blocking capacitors 526 and 528 are also incorporated in the VGA 500 before PAs 504 and 506, respectively. An additional DC blocking capacitor 530 is included after PA 506. The DC blocking capacitors 524-528 all provide better stability and result in lower return losses in the VGA 500.

Figure 6:
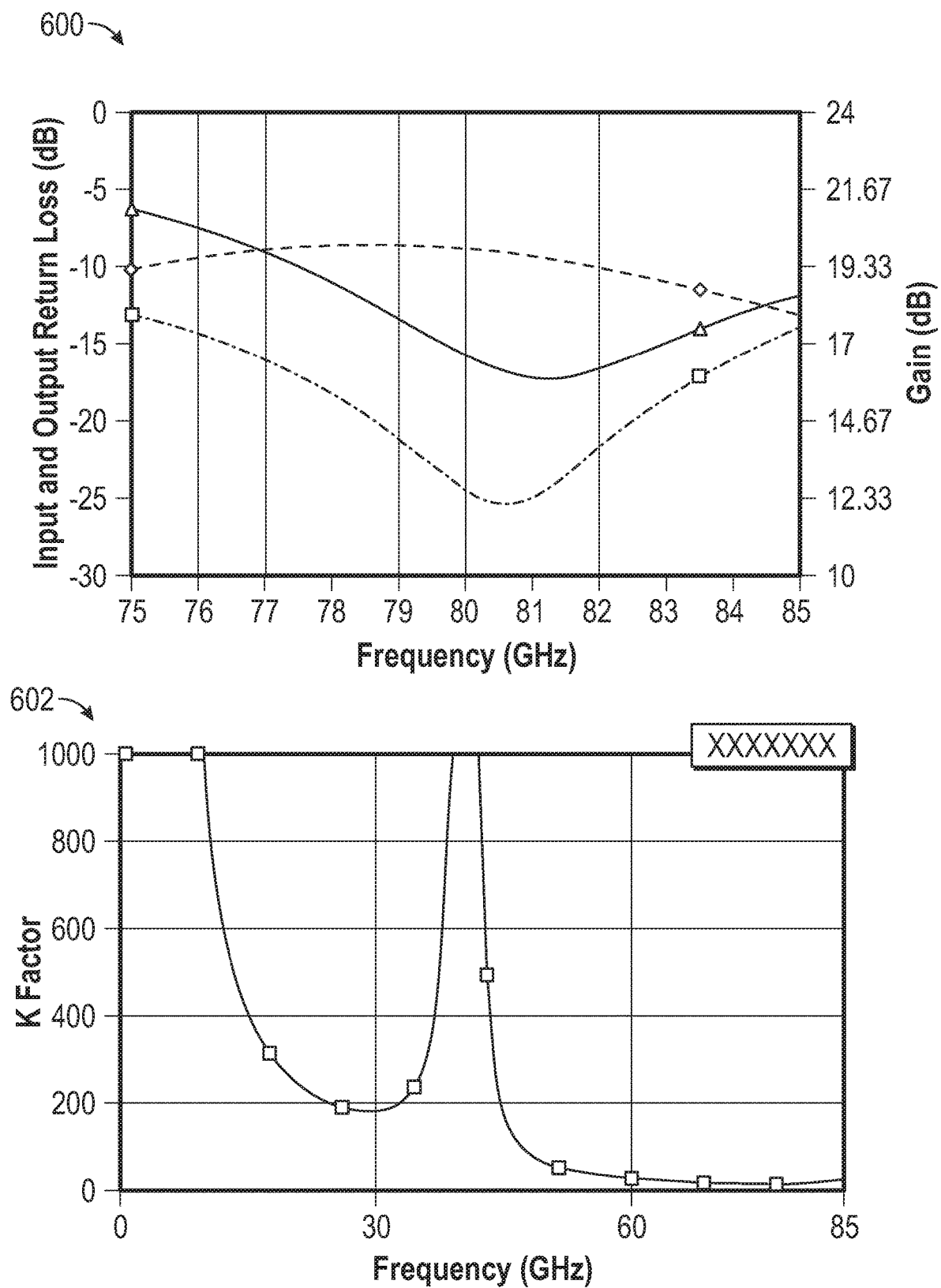
FIG. 6 illustrates the return losses, amplifier gain, and the K factor for a 3-stage, unconditionally stable VGA implemented as in FIG. 5 and in accordance with various examples.

FIG. 6 illustrates the return losses and amplifier gain indicated by the S parameters in graph 600 and the K factor over mm-wave frequencies of interest in graph 602. For example, at a frequency of 78.5 GHz, graph 600 shows an amplifier gain of around 20 dB and graph 602 shows a K factor>1. The unconditionally stability, high gain and low return loss of the VGA 500 enables a vector modulator implemented as in FIG. 1 to achieve its desired phase shifts in a 360° range, while providing amplitude gains at mm-wave frequencies in applications as varied as wireless communications and autonomous driving. The high gain of the VGA 500 enables the VGA stage 108 to achieve the full 360° phase range at a good resolution while minimizing loss through the circuit. In various examples, to achieve a certain phase, VGA 108 may have different operating modes, such as two of its four VGAs may operate together, while the other two are turned off. The high gain of each VGA 500 enables the final output signal in VGA stage 108, which is a vector sum of the amplification and attenuation of the four individual VGA branches, to have an overall constant high gain and amplitude.

Figure 7:
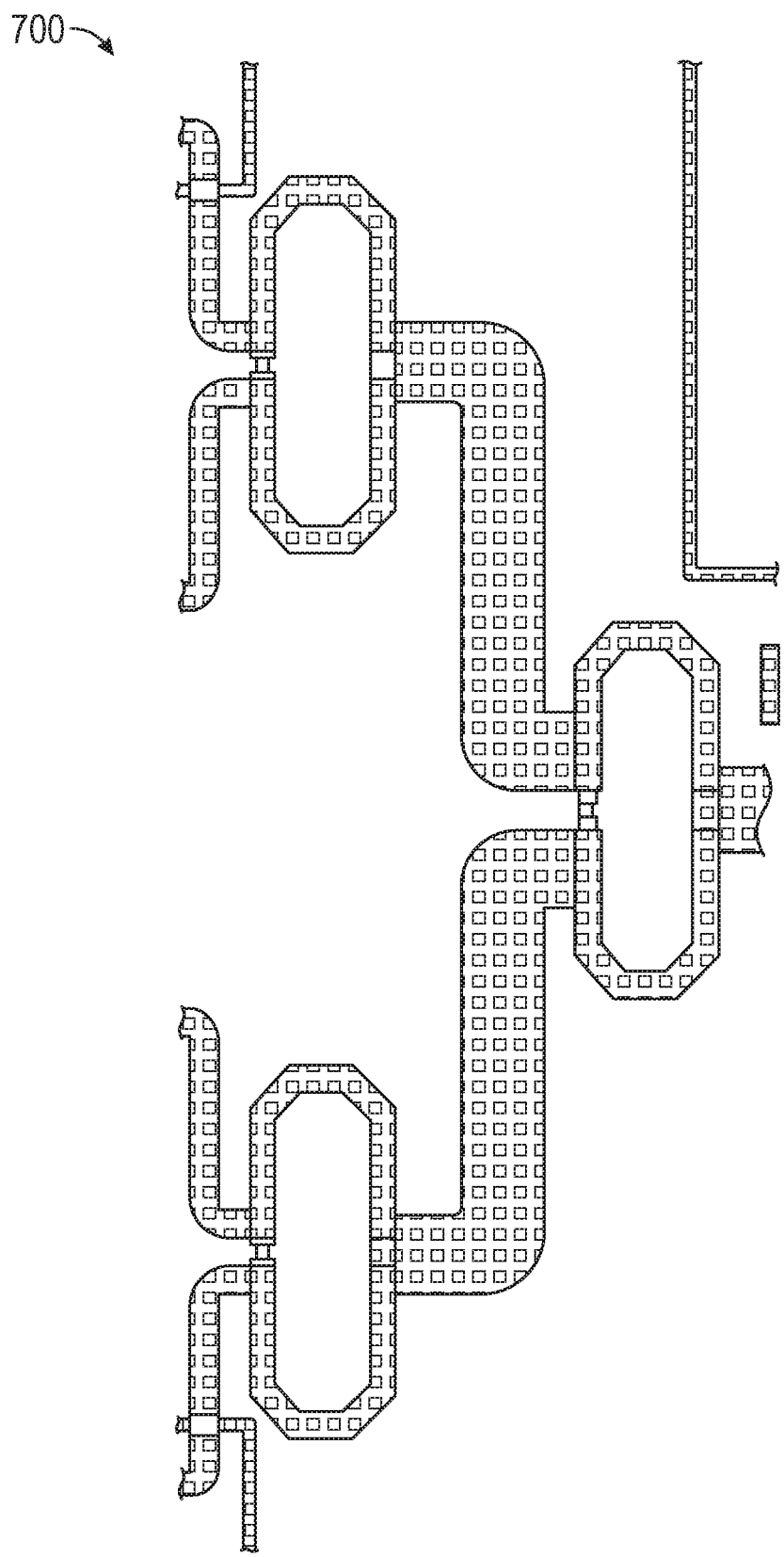
FIG. 7 illustrates a design layout for a Wilkinson power combiner for use in a vector modulator implemented as in FIG. 1 and in accordance with various examples.
Figure 8:
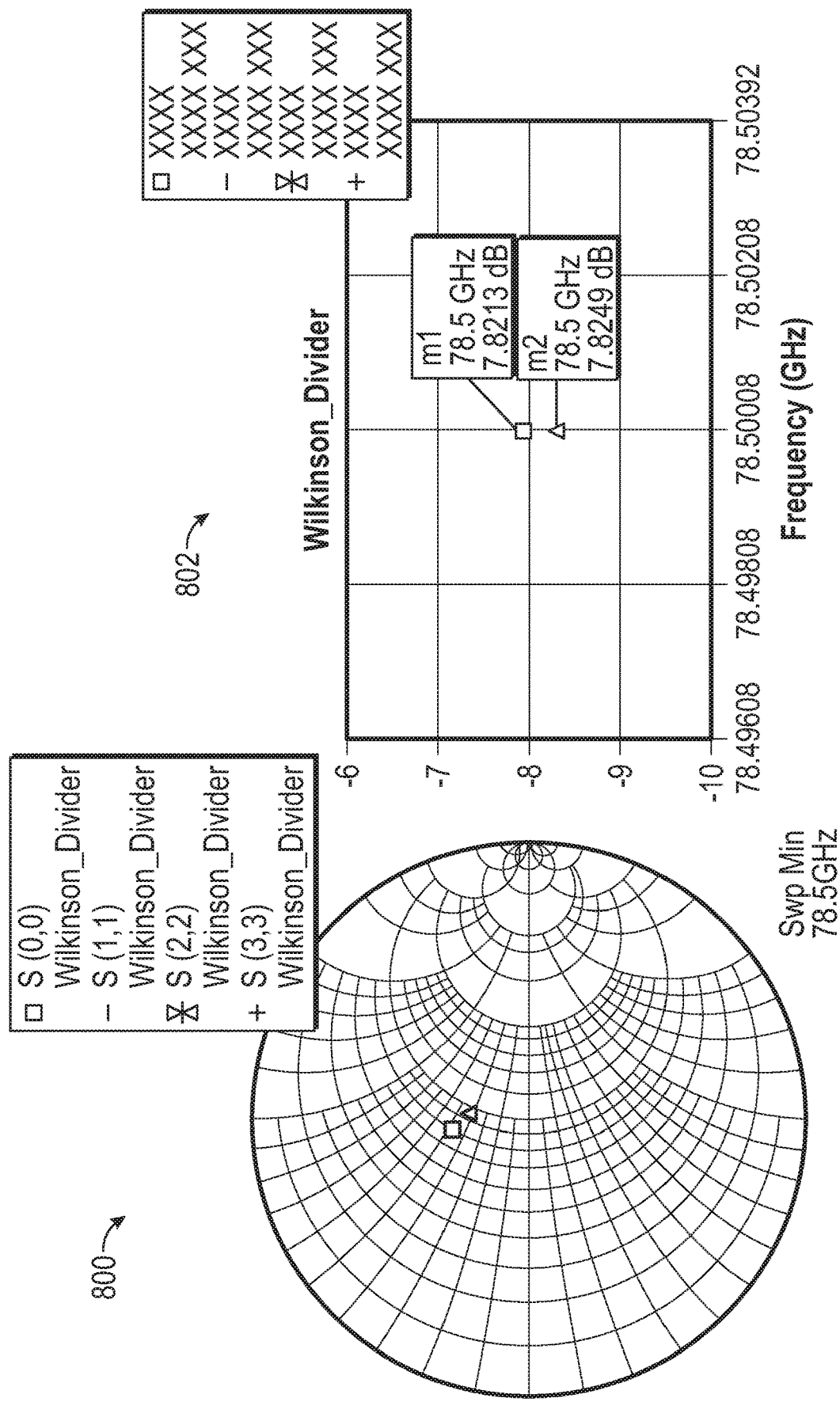
FIG. 8 are graphs illustrating a Smith chart and losses over frequencies for a Wilkinson power combiner implemented as in FIG. 7 and in accordance with various examples.

Referring back to FIG. 1, the VGA stage 108 has four VGAs that may be implemented as in the example of FIG. 5 to output four amplified quadrature RF signals. The four signals are combined by the 4-way power combiner 110. In various examples, the 4-way power combiner 110 may be implemented as a Wilkinson power combiner. In other examples, the 4-way power combiner 110 may have different desired configurations, e.g., reactive splitters, hybrid splitters, etc. An example Wilkinson power combiner is illustrated in FIG. 7. Power combiner 700 is a 4-way Wilkinson power combiner with 4 ports matched to 50 ohms at a loss of around 8 dB. FIG. 8 illustrates a Smith chart 800 and a graph 802 showing the losses at a mm-wave frequency of 78.5 GHz.

Figure 9:
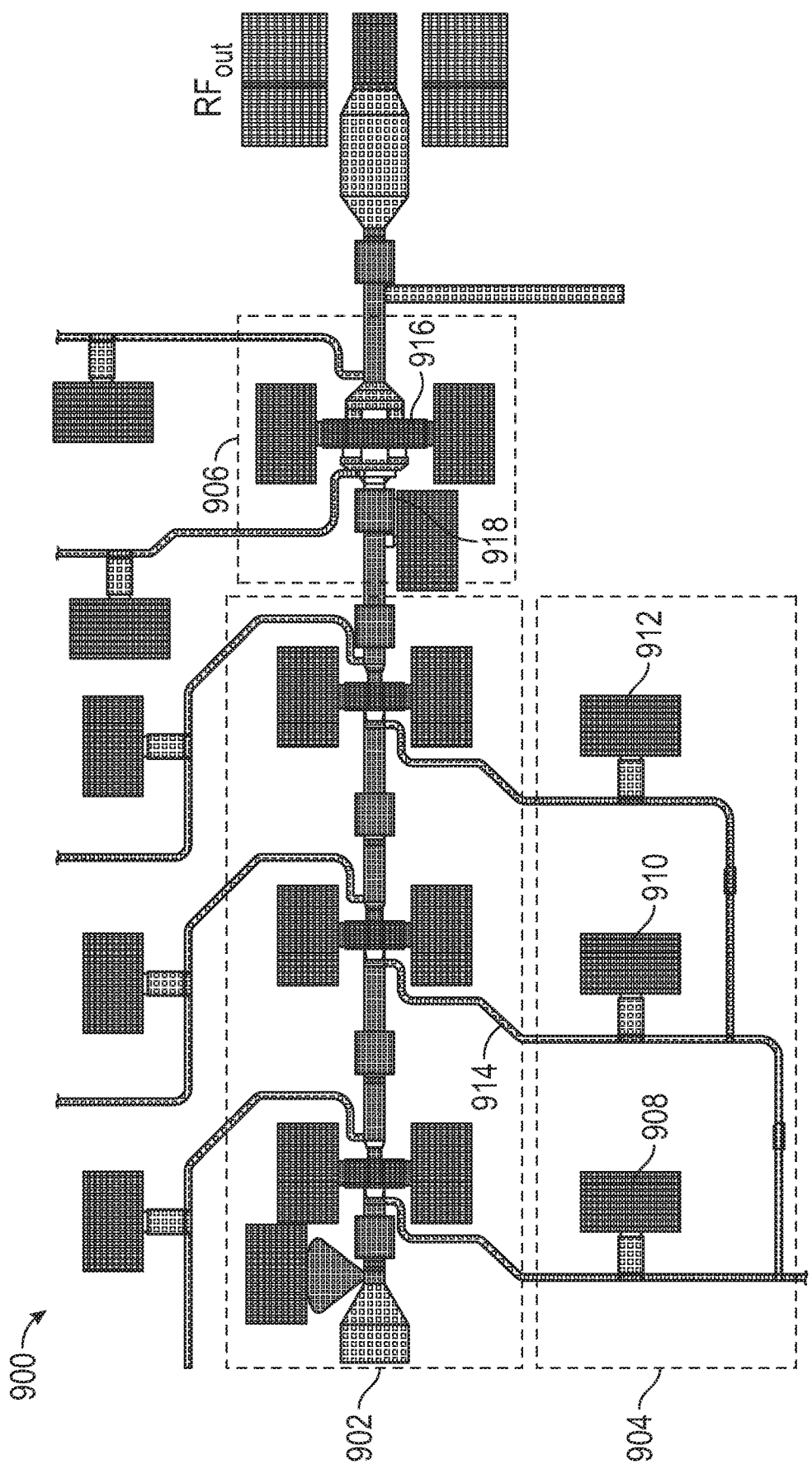
FIG. 9 is a schematic diagram of a PA for use in a final amplifier stage implemented as in FIG. 1 and in accordance with various examples.

The power combiner 110 in FIG. 1 outputs a combined RF signal that is further amplified in a final amplifier stage 104. FIG. 9 illustrates a schematic diagram of a PA for use in a final amplifier stage implemented as in FIG. 1 and in accordance with various examples. PA 900 is designed with three main circuit structures to compensate for losses in the earlier circuit structures of vector modulator architecture 100 and provide further amplification gain: (1) a 3-stage, unconditionally stable VGA 902; (2) a bypass capacitor stage 904; and (3) a PA stage 906. The VGA 902 may be implemented as in FIG. 5 to provide an amplification gain with low return losses while achieving unconditional stability. The bypass capacitor stage 904 includes 3 bypass capacitors 908-912 to provide stability in the bias line network in the VGA 902, e.g., in bias line 914.

Figure 10:
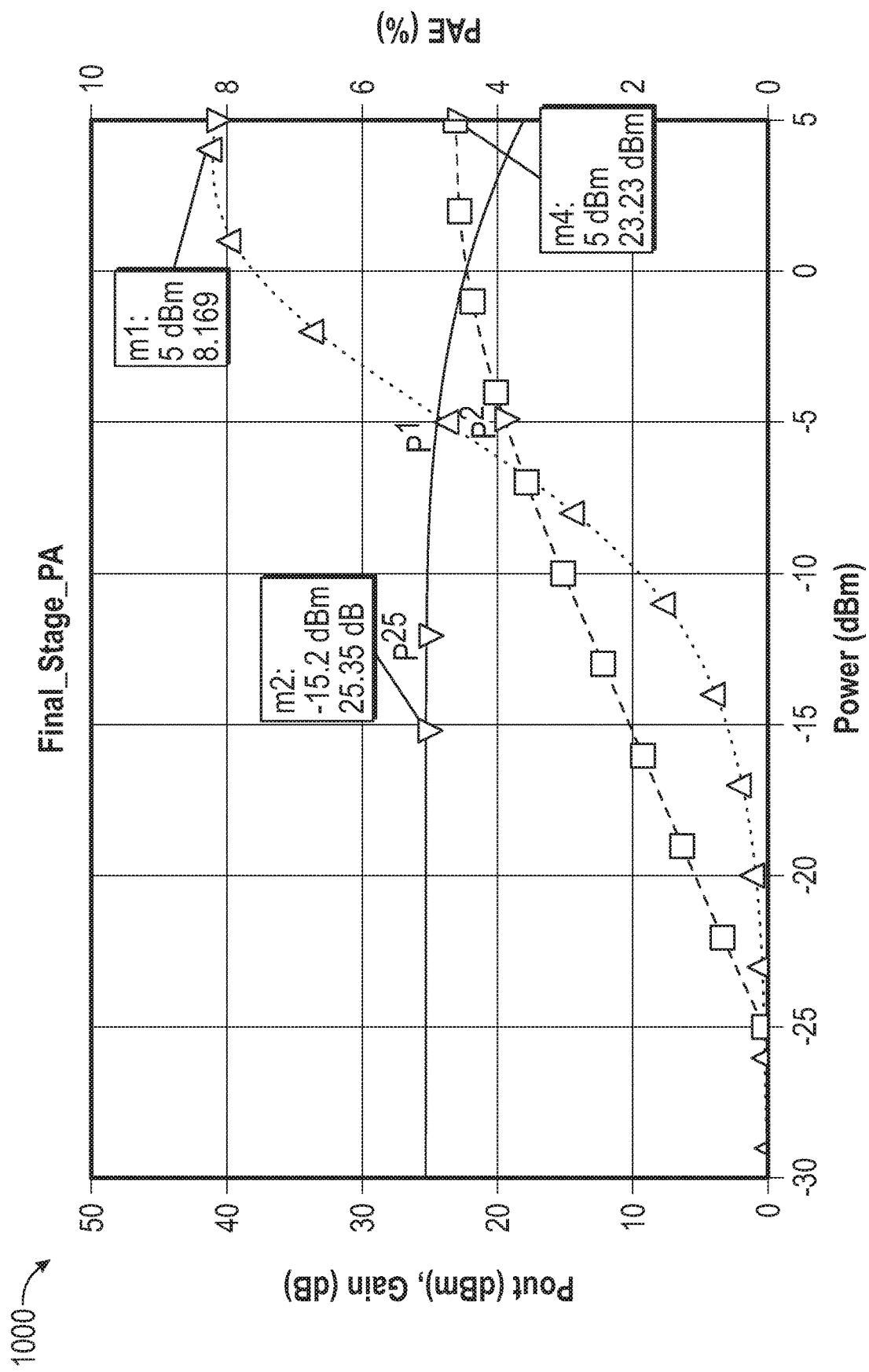
FIG. 10 is a graph illustrating the total gain, efficiency and output power from a PA implemented as in FIG. 9 and in accordance with various examples.
Figure 11:
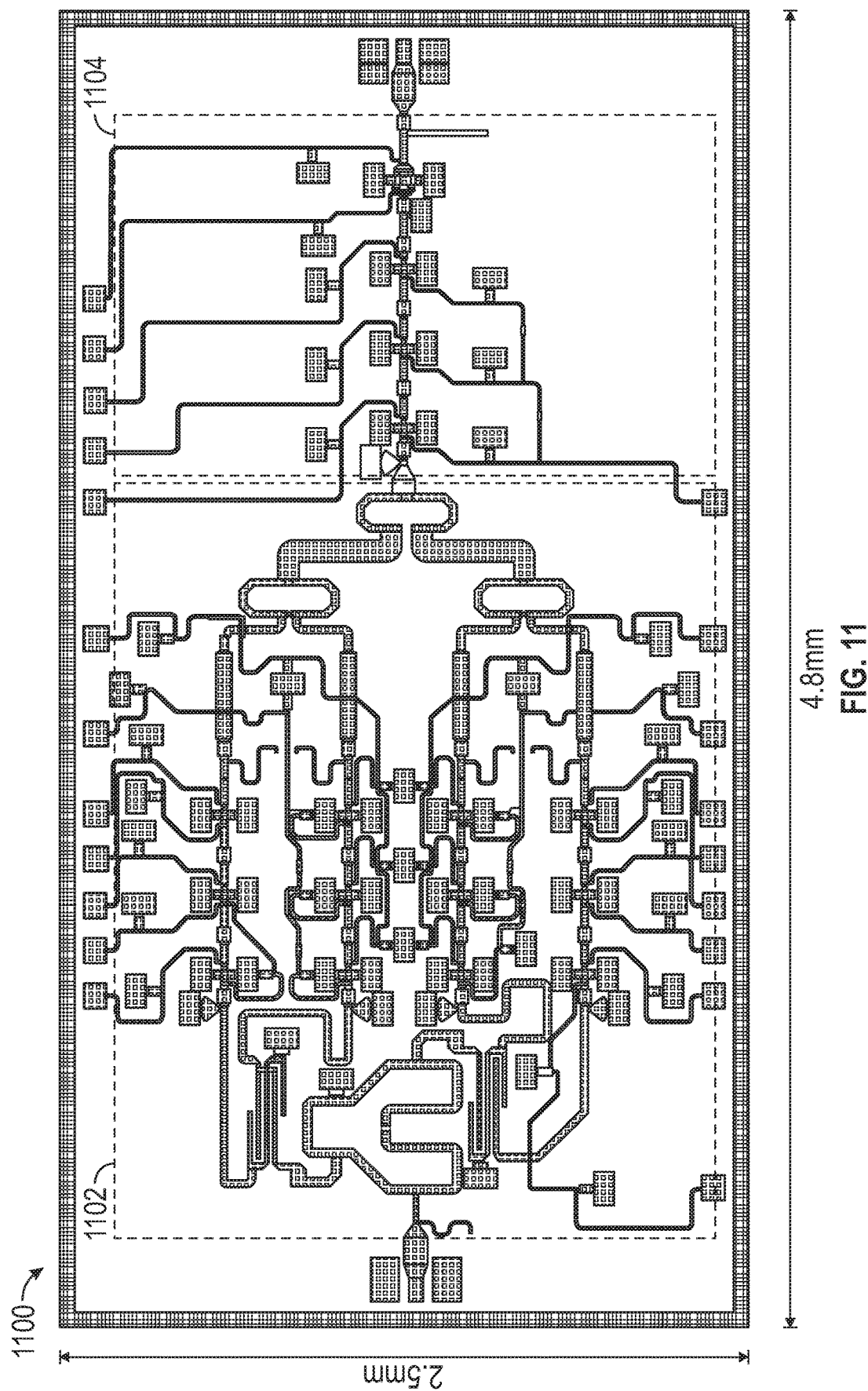
FIG. 11 is a circuit layout of a board with a vector modulator architecture implemented as in FIG. 1.

The PA stage 906 includes a single 4×50 μm GaN pHEMT device 916 with a blocking capacitor 918. PA stage 906 is a small high pass filtering stage for further stability, matching and power gain. The total gain, efficiency and output power from the PA 900 are shown in graph 1000 in FIG. 10. PA 900 results in a total power output of around 23.2 dBm, a gain of around 25 dB and a Power Added Efficiency ("PAE") of around 8%. Use of a PA 900 together with a vector modulator 102 as in FIG. 1 enables phase shifts across a 360° range at a gain of 25-30 dB to be realized in a stable circuit at mm-wave frequencies. The resulting architecture illustrated in a layout in FIG. 11 can be manufactured in a 2.5 mm×4.8 mm board 1100 for use in many mm-wave applications, including in wireless communications and autonomous driving.

Figure 12:
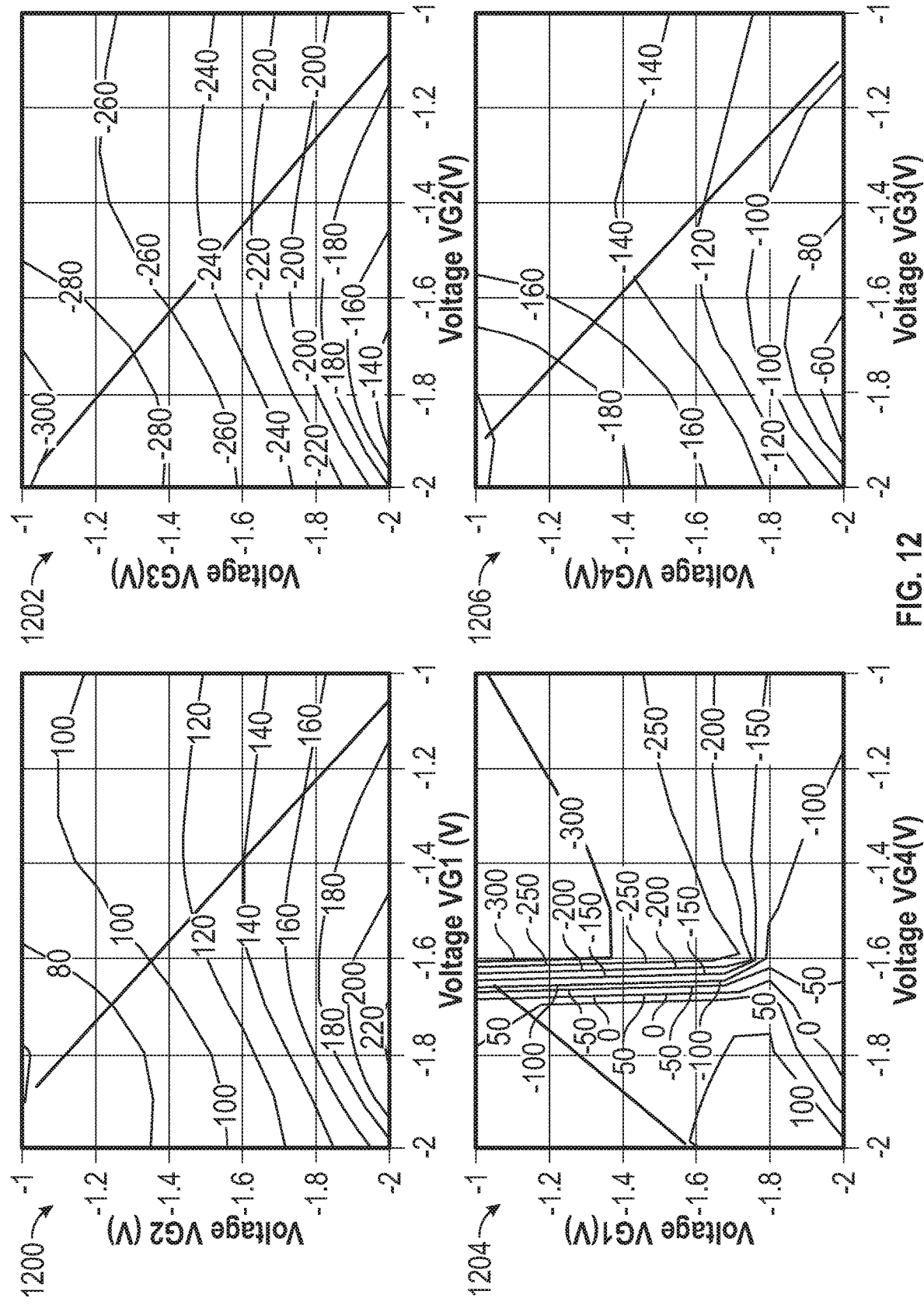
FIG. 12 are graphs illustrating the phase performance of a vector modulator architecture implemented as in FIG. 1 and in accordance with various examples.
Figure 13:
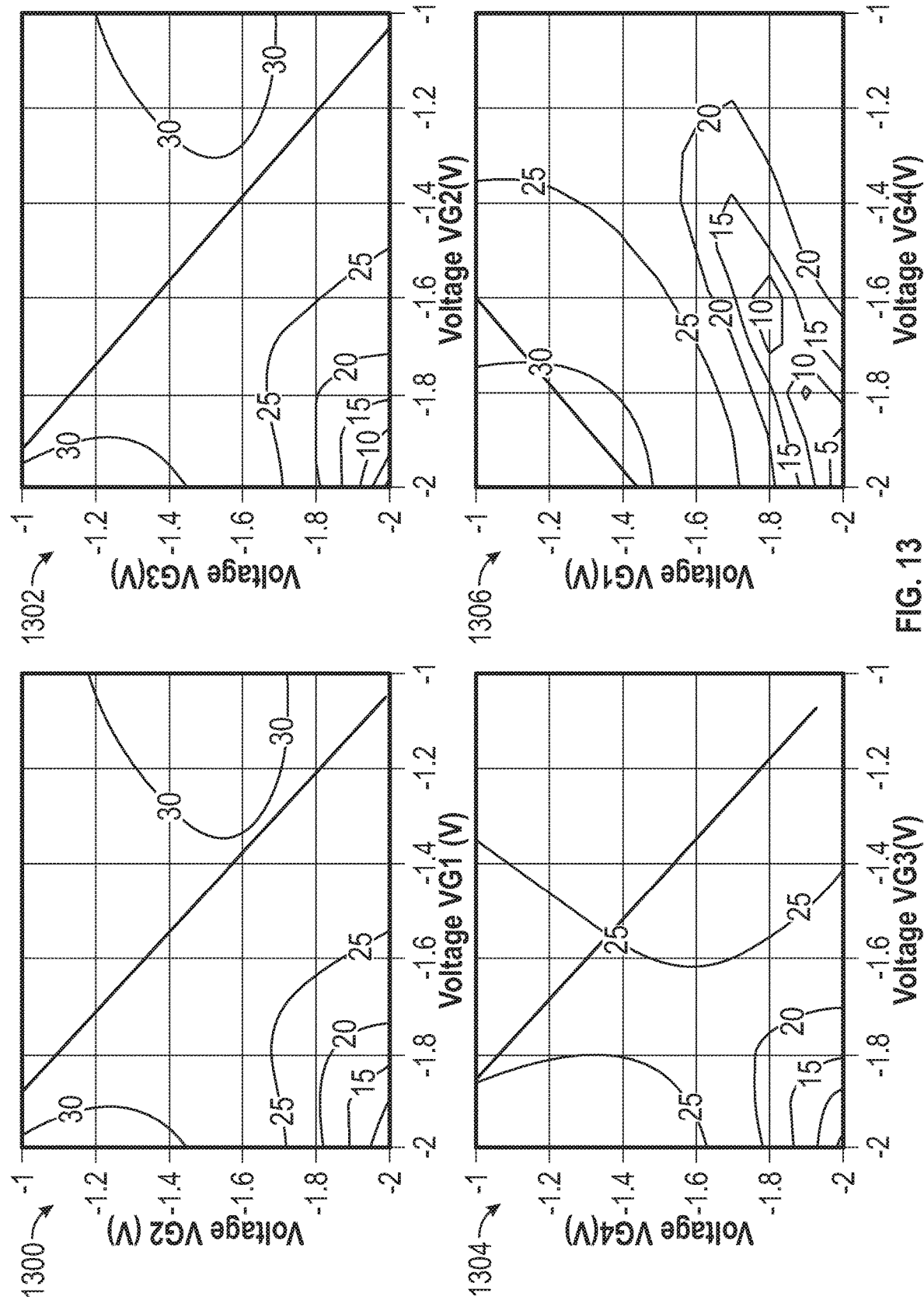
FIG. 13 are graphs illustrating the gain performance of a vector modulator architecture implemented as in FIG. 1 and in accordance with various examples.

Attention is now directed to FIGS. 12 and 13, which illustrate performance results for an example vector modulator architecture implemented as in FIG. 1. FIG. 12 shows the phase performance in graphs 1200-1206, and FIG. 13 shows the gain performance in graphs 1300-1306. The straight line shown in graphs 1200-1206 and 1300-1306 represent control voltages and the curves in the graphs represent the various phase shifts and amplifier gains that can be achieved at different gate bias voltages. As shown in the graphs, phase shifts across a 360° range and amplifier gains in the 25-30 dB range are achievable with the vector modulator architecture described herein.

Figure 14:
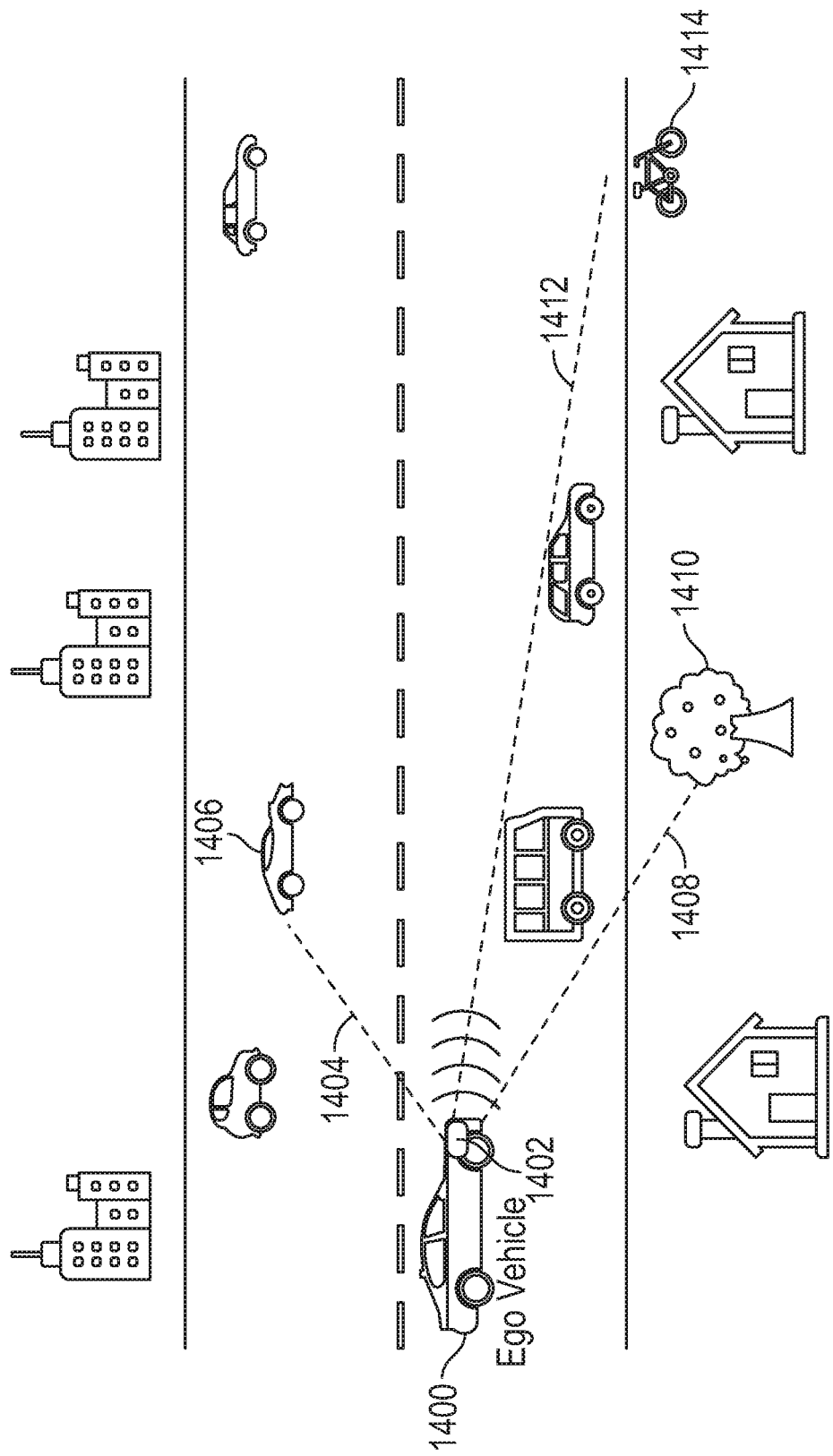
FIG. 14 is an example environment in which a vector modulator architecture is implemented in a radar in an autonomous vehicle.

In various examples, the vector modulator architecture is suitable to many mm-wave applications, including in wireless communications and in autonomous vehicles. The vector modulator architecture may be applicable, for example, in a radar in an autonomous vehicle to achieve beam steering. Referring to FIG. 14, an example environment in which a vector modulator architecture is implemented in a radar in an autonomous vehicle is described.

Ego vehicle 1400 is an autonomous vehicle having a radar 1402 with an analog beamforming antenna employing a vector modulator architecture to achieve phase shifts in RF beams in a full FoV. In various examples, radar 1402 can scan a 360° FoV to have a true 3D vision and human-like interpretation of the ego vehicle's path and surrounding environment. The analog beamforming antenna in radar 1402 radiates dynamically controllable and highly-directive RF beams. The RF beams reflect from targets in the vehicle's path and surrounding environment and the RF reflections are received by the radar 1402 for target detection and identification.

In the illustrated example, radar 1402 generates a beam 1404 to detect vehicle 1406, a beam 1408 to detect tree 1410 and a beam 1412 to detect bicycle 1414. Each of the beams 1404, 1408 and 1412 is generated with a set of parameters, such as beam width and phase. The phase of each beam is controlled by Phase Control Elements ("PCEs") in the analog beamforming antenna in radar 1402. A PCE may include a varactor, a set of varactors, a phase shift network, or a vector modulator architecture implemented as in FIG. 1 to achieve any desired phase shift from 0° to 360°.

Figure 15:
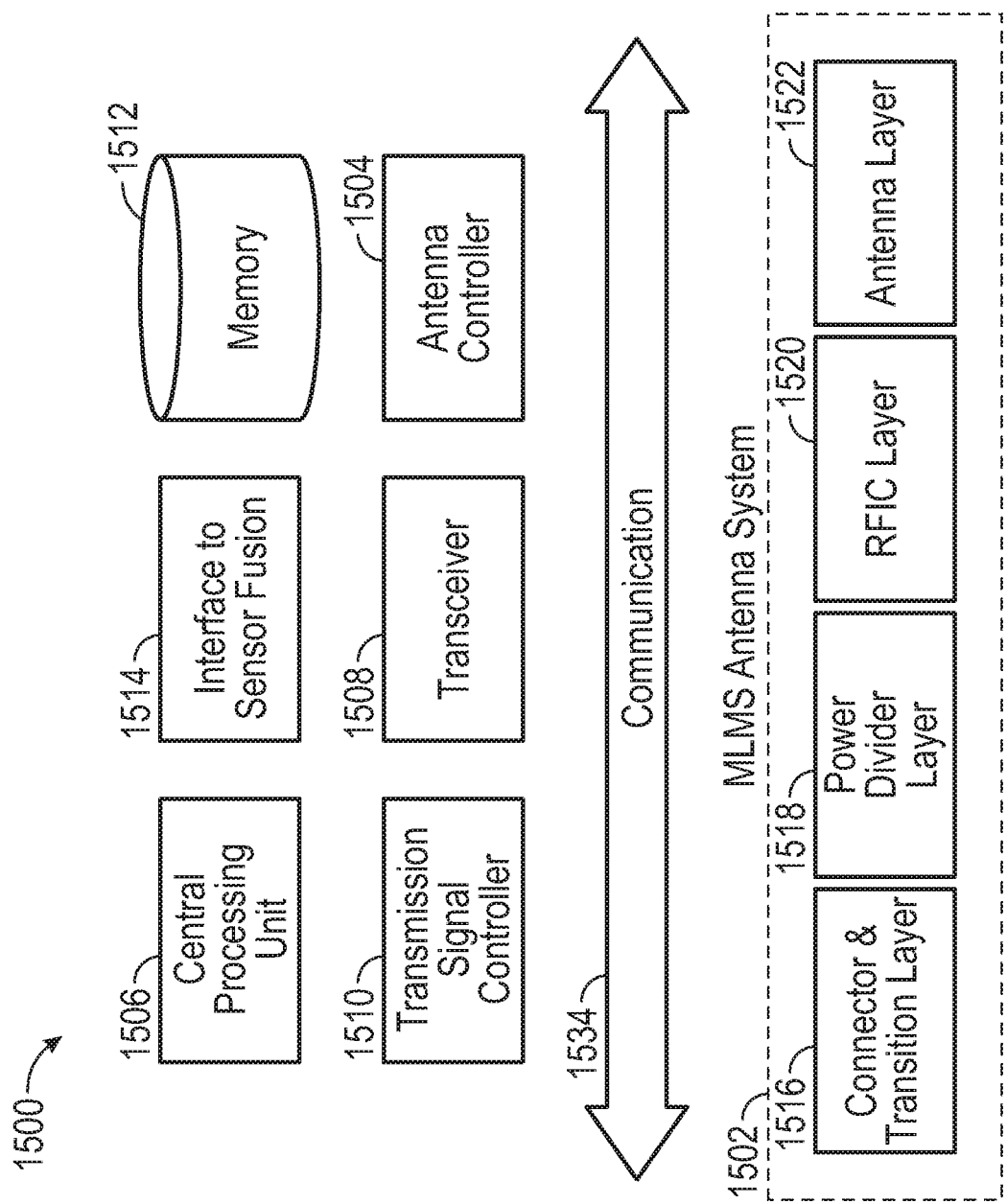
FIG. 15 is a schematic diagram of an antenna module for use with a radar system implemented as in FIG. 14 and in accordance with various examples.

FIG. 15 shows a schematic diagram of an antenna module for use with a radar system implemented as in FIG. 14 and in accordance with various examples. Multi-Layer, Multi-Steering ("MLMS") antenna module 1500 has an MLMS antenna system 1502 coupled to an antenna controller 1504, a central processor 1506, and a transceiver 1508. A transmission signal controller 1510 generates a transmission signal, such as an FMCW signal, which is used for radar sensor applications as the transmitted signal is modulated in frequency, or phase. The FMCW signal enables a radar to measure range to a target by measuring the phase differences in phase or frequency between the transmitted signal and the received or reflected signal. Within FMCW formats, there are a variety of modulation patterns that may be used within FMCW, including triangular, sawtooth, rectangular and so forth, each having advantages and purposes.

For example, sawtooth modulation may be selected for use when detection involves large distances to a target, i.e., long range. In some examples, the shape of the wave form provides speed and velocity information based on the Doppler shift between signals. This information enables construction of a range-Doppler map to indicate a location and movement of a detected object. As used herein, a target is any object detected by the radar, but may also refer to a specific type of object, e.g., a vehicle, a person, a road sign, and so on.

Other modulation types may be incorporated according to the desired information and specifications of a system and application. In another example applications, the MLMS antenna module 1500 is applicable in a wireless communication or cellular system, implementing user tracking from a base station, fixed wireless location, and so forth, or function as a wireless relay to provide expanded coverage to users in a wireless network. The transmission signal in cellular communications is a coded signal, such as a cellular modulated Orthogonal Frequency Division Multiplexed ("OFDM") signal. Other types of signals may also be used with radiating structure 100, depending on the desired application.

In various examples, the MLMS antenna system 1502 radiates the signal through a structure consisting of four main layers: (1) connector and transition layer 1516; (2) power divider layer 1518; (3) RFIC layer 1520; and (4) antenna layer 1522. The connector and transition layer 1516 couples the transmission signal from the transmission signal controller 1510 to the PCB for transmission to the power divider layer 1518. The power divider layer 1518 is a corporate feed structure having a plurality of transmission lines for transmitting the signal to the antenna layer 1522. The antenna layer 1522 includes a plurality of radiating slots for radiating the signal into the air. The slots are configured in a specific pattern as described below, but other patterns, shapes, dimensions, orientations and specifications may be used to achieve a variety of radiation patterns. The RFIC layer 1520 includes phase shifters (e.g., a vector modulator architecture) to achieve any desired phase shift from 0° to 360°. The RFIC layer 1520 also includes transitions from the power divider layer 1518 to the RFIC layer 1520 and from the RFIC layer 1520 to the antenna layer 1522.

Note that as illustrated, there is one MLMS antenna system 1502 in MLMS antenna module 1500. However, an MLMS antenna module 1500 may have multiple MLMS antenna systems in any given configuration. A set of MLMS antennas may be designated as transmit antennas, and another set may be designated as receive antennas. Further, an MLMS antenna may be orthogonal from another. Different MLMS antennas may also have different polarizations. In various examples, different MLMS antennas may be configured to detect different targets, e.g., a set of antennas may be configured to enhance the detection and identification of pedestrians, another set of antennas may be configured to enhance the detection and identification of vehicles, and so forth. In the case of pedestrians, the configuration of the antennas may include power amplifiers to adjust the power of a transmitted signal and/or different polarization modes for different arrays to enhance pedestrian detection. It is appreciated that numerous configurations of MLMS antennas may be implemented in a given antenna module.

In operation, the antenna controller 1504 receives information from other modules in the radar (e.g., a perception or AI module) indicating a next radiation beam, wherein a radiation beam may be specified by parameters such as beam width, transmit angle, transmit direction and so forth. The antenna controller 1504 determines a voltage matrix to apply to reactance control mechanisms in the MLMS antenna system 1502 to achieve a given phase shift or other parameters.

Transceiver 1508 prepares a signal for transmission, such as a signal for a radar device, wherein the signal is defined by modulation and frequency. The signal is received by the MLMS antenna system 1502 and the desired phase of the radiated signal is adjusted at the direction of the antenna controller 1504. In some examples, the MLMS antenna system 1502 can be implemented in many applications, including radar, cellular antennas, and autonomous vehicles to detect and identify targets in the path of or surrounding the vehicle. Alternate examples may use the MLMS antenna for wireless communications, medical equipment, sensing, monitoring, and so forth. Each application type incorporates designs and configurations of the elements, structures and modules described herein to accommodate their needs and goals.

In antenna module 1500, a signal is specified by antenna controller 1504, which may be at the direction of a perception or AI module in the radar, a sensor fusion module via interface to sensor fusion 1514, or it may be based on program information from memory storage 1512. There are a variety of considerations to determine the beam formation, wherein this information is provided to antenna controller 1504 to configure the various elements of the MLMS antenna system 1502. The transmission signal controller 1510 generates the transmission signal and provides it to the MLMS antenna system 1502, such as through a coaxial cable or other connector. The signal propagates through the connector and transition layer 1516 to the antenna layer 1522 for transmission through the air.

The antenna layer 1522 may be referred to as a type of slotted waveguide antenna ("SWA"), wherein the power divider layer 1516 acts as a feed to the antenna layer 1522. Alternate examples may reconfigure and/or modify the antenna structure to improve radiation patterns, bandwidth, side lobe levels, and so forth. The antenna performance may be adjusted by design of the antenna's features and materials, such the shape of the slots, slot patterns, slot dimensions, conductive trace materials and patterns, as well as other modifications to achieve impedance matching and so forth.

Figure 16:
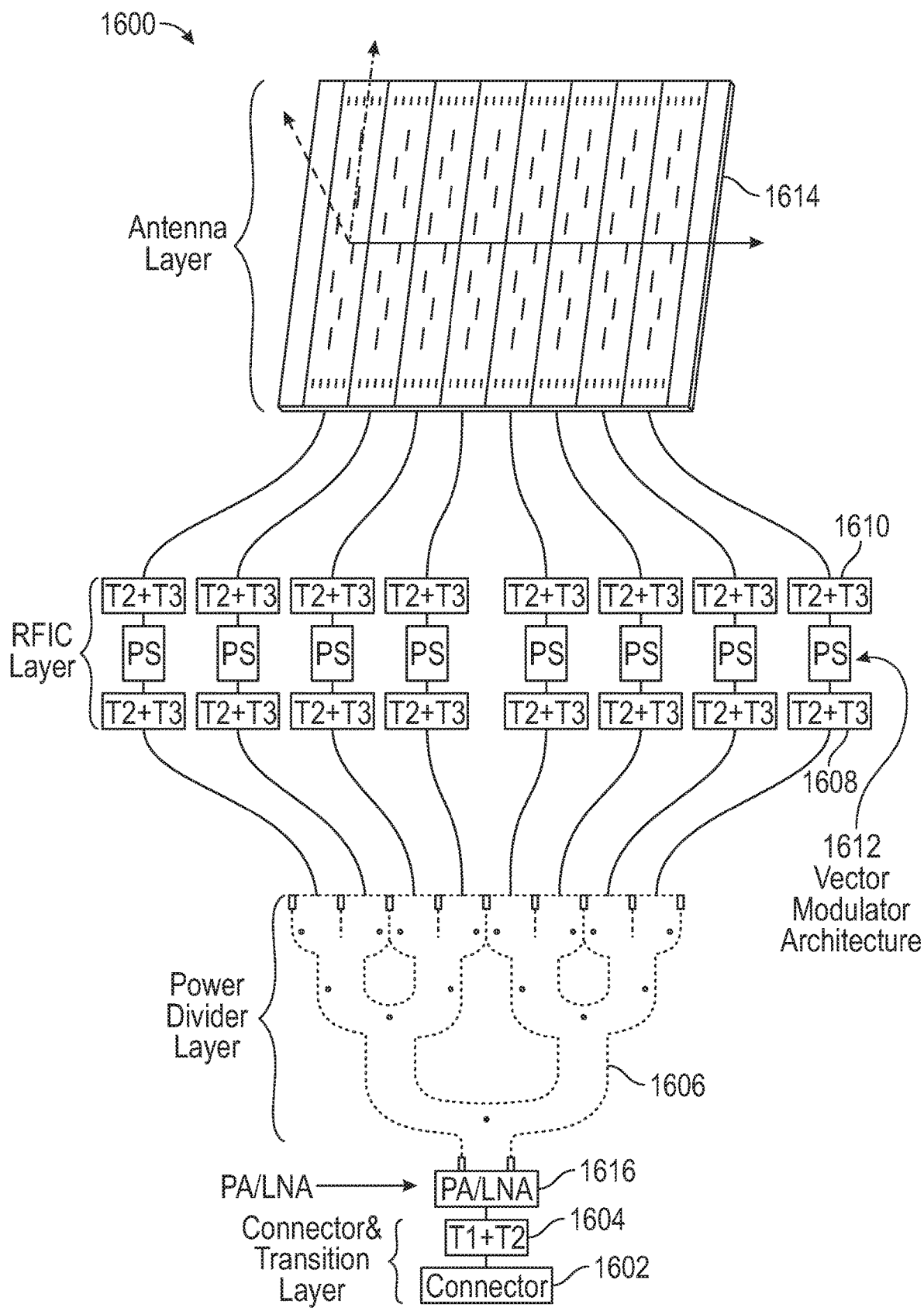
FIG. 16 is a schematic diagram of an antenna system for use with the antenna of FIG. 15 in accordance with various examples.

Attention is now directed to FIG. 16, which is a schematic diagram of an antenna system for use with the antenna of FIG. 15 in accordance with various examples. In the example of FIG. 16, the antenna system 1600 has a connector 1602 and transition 1604 in a connector and transition layer, a power divider layer 1606, an RFIC layer with transitions 1608-1610 and phase shifters 1612, and an antenna layer 1614. Antenna system 1600 also has a Power Amplifier ("PA") and a Low Noise Amplifier ("LNA") module 1616 to boost the transmission signal coming from the connector 1602 before its split through the power divider layer 1606.

The power divider layer 1606 is a type of a power divider circuit such that it takes an input signal and divides it through a network of paths or transmission lines. Each path may have similar dimensions; however, the size of the paths may be configured to achieve a desired transmission and/or radiation result. The power divider layer 1606 is designed to be impedance-matched, such that the impedances at each end of a transmission line matches the characteristic impedance of the line. Each transmission line is bounded by a set of vias. In various examples, the phase shifters 1612 are implemented with a vector modulator architecture described herein above. The vector modulator architecture enables phase shifts across a 360 range to be achieved with unconditionally stable PAs providing gains up to 25-30 dB at mm-wave frequencies of interest.

It is also appreciated that the previous description of the disclosed examples is provided to enable any person skilled in the art to make or use the present disclosure. Various modifications to these examples will be readily apparent to those skilled in the art, and the generic principles defined herein may be applied to other examples without departing from the spirit or scope of the disclosure. Thus, the present disclosure is not intended to be limited to the examples shown herein but is to be accorded the widest scope consistent with the principles and novel features disclosed herein.

As used herein, the phrase "at least one of" preceding a series of items, with the terms "and" or "or" to separate any of the items, modifies the list as a whole, rather than each member of the list (i.e., each item). The phrase "at least one of" does not require selection of at least one item; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

Furthermore, to the extent that the term "include," "have," or the like is used in the description or the claims, such term is intended to be inclusive in a manner similar to the term "comprise" as "comprise" is interpreted when employed as a transitional word in a claim.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

While this specification contains many specifics, these should not be construed as limitations on the scope of what may be claimed, but rather as descriptions of particular implementations of the subject matter. Certain features that are described in this specification in the context of separate implementations can also be implemented in combination in a single implementation. Conversely, various features that are described in the context of a single implementation can also be implemented in multiple implementations separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. Moreover, the separation of various system components in the aspects described above should not be understood as requiring such separation in all aspects, and it should be understood that the described program components and systems can generally be integrated together in a single hardware product or packaged into multiple hardware products. Other variations are within the scope of the following claim.

What is claimed is:

1. A vector modulator architecture for millimeter wave applications, comprising:
   a 4-way input splitter network configured to receive a radio frequency (RF) input signal and generate a plurality of quadrature signals at different phases;
   a variable gain amplifier (VGA) stage coupled to the 4-way input splitter network and configured to apply a first gain to one or more of the plurality of quadrature signals;
   a power combiner coupled to the VGA stage and configured to combine the plurality of quadrature signals into a combined RF signal; and
   a power amplifier (PA) stage coupled to the power combiner and configured to apply a second gain to the combined RF signal and generate an output RF signal, wherein the VGA stage comprises a plurality of VGA circuits each comprising a radial stub coupled to a blocking capacitor and configured to provide a low frequency stub to a transmission line.

2. The vector modulator architecture of claim 1, wherein the 4-way input splitter network comprises a rat-race coupler connected to a plurality of Lange couplers.

3. The vector modulator architecture of claim 1, wherein the plurality of quadrature signals comprises a first signal at a first degree, a second signal at a second degree in quadrature with the first signal, a third signal at a third degree in quadrature with the second signal, and a fourth signal at a fourth degree in quadrature with the third signal.

4. The vector modulator architecture of claim 1, wherein the plurality of quadrature signals is coupled to respective ones of the plurality of VGA circuits on separate transmission lines to the power combiner.

5. The vector modulator architecture of claim 1, wherein each of the plurality of VGA circuits comprises a plurality of power amplifiers connected in series.

6. The vector modulator architecture of claim 5, wherein each of the plurality of VGA circuits comprises a plurality of blocking capacitors coupled to the plurality of power amplifiers and configured to filter out low frequency components from a corresponding quadrature signal.

7. The vector modulator architecture of claim 6, wherein a first blocking capacitor of the plurality of blocking capacitors is interposed between the radial stub and a first power amplifier of the plurality of power amplifiers, a second blocking capacitor of the plurality of blocking capacitors is interposed between the first power amplifier and a second power amplifier of the plurality of power amplifiers, and a third blocking capacitor of the plurality of blocking capacitors is interposed between the second power amplifier and a third power amplifier of the plurality of power amplifiers.

8. The vector modulator architecture of claim 1, wherein the PA stage is a first PA stage comprising:
   a second VGA circuit configured to apply a variable gain to the combined RF signal;
   a bypass capacitor stage coupled to the second VGA circuit and configured to filter out high frequency components from the combined RF signal; and
   a second PA stage coupled to the bypass capacitor stage and configured to apply a final gain to the combined RF signal that provides the output RF signal with the second gain.

9. The vector modulator architecture of claim 8, wherein the second VGA circuit comprises a plurality of power amplifiers connected in series, wherein the bypass capacitor stage comprises a plurality of bypass capacitors coupled in parallel and coupled to inputs to respective ones of the plurality of power amplifiers.

10. The vector modulator architecture of claim 8, wherein the second PA stage comprises a pseudomorphic high-electron-mobility transistor (pHEMT) device and a blocking capacitor coupled to the pHEMT device, wherein the blocking capacitor is coupled between an output of the second VGA circuit and an input to the pHEMT device.

11. An antenna system for autonomous vehicles, comprising:
   a radio frequency integrated circuit (RFIC) layer comprising a plurality of phase shifters, each of the plurality of phase shifters comprising a vector modulator architecture comprising:
   a 4-way input splitter network configured to receive a radio frequency (RF) input signal and generate a plurality of quadrature signals at different phases;
   a variable gain amplifier (VGA) stage coupled to the 4-way input splitter network and configured to apply a first gain to one or more of the plurality of quadrature signals;
   a power combiner coupled to the VGA stage and configured to combine the plurality of quadrature signals into a combined RF signal; and
   a power amplifier (PA) stage coupled to the power combiner and configured to apply a second gain to the combined RF signal and generate an output RF signal, wherein the VGA stage comprises a plurality of VGA circuits each comprising a radial stub coupled to a blocking capacitor and configured to provide a low frequency stub to a transmission line.

12. The antenna system of claim 11, wherein the 4-way input splitter network comprises a rat-race coupler connected to a plurality of Lange couplers.

13. The antenna system of claim 11, wherein the plurality of quadrature signals is coupled to respective ones of the plurality of VGA circuits on separate transmission lines to the power combiner.

14. The antenna system of claim 11, wherein each of the plurality of VGA circuits comprises a plurality of power amplifiers connected in series, wherein each of the plurality of VGA circuits comprises a plurality of blocking capacitors coupled to the plurality of power amplifiers configured to filter out low frequency components from a corresponding quadrature signal.

15. The antenna system of claim 11, wherein the PA stage is a first PA stage comprising:
   a second VGA circuit configured to apply a variable gain to the combined RF signal;
   a bypass capacitor stage coupled to the second VGA circuit and configured to filter out high frequency components from the combined RF signal; and a second PA stage coupled to the bypass capacitor stage and configured to apply a final gain to the combined RF signal that provides the output RF signal with the second gain.

16. The antenna system of claim 15, wherein the second VGA circuit comprises a plurality of power amplifiers connected in series, wherein the bypass capacitor stage comprises a plurality of bypass capacitors coupled in parallel and coupled to inputs to respective ones of the plurality of power amplifiers.

17. The antenna system of claim 16, wherein the second PA stage comprises a pseudomorphic high-electron-mobility transitor (pHEMT) device and a blocking capacitor coupled to the pHEMT device, wherein the blocking capacitor is coupled between an output of the second VGA circuit and an input to the pHEMT device.

18. A radar system for use in an autonomous driving vehicle, comprising:
   an antenna module configured to radiate a transmission signal with an analog beamforming antenna in a plurality of directions based on phase shifts applied by a vector modulator architecture in the antenna module and to generate radar data capturing a surrounding environment, wherein the vector modulator architecture comprises:
      a 4-way input splitter network configured to receive a radio frequency (RF) input signal and generate a plurality of quadrature signals at different phases;
      a variable gain amplifier (VGA) stage coupled to the 4-way input splitter network and configured to amplify one or more of the plurality of quadrature signals with a first gain;
      a power combiner coupled to the VGA stage and configured to combine the plurality of quadrature signals into a combined RF signal; and
      a power amplifier (PA) stage coupled to the power combiner and configured to amplify the combined RF signal with a second gain and generate the transmission signal from the amplified RF signal,
         wherein the VGA stage comprises a plurality of VGA circuits each comprising a radial stub coupled to a blocking capacitor and configured to provide a low frequency stub to a transmission line; and
   a perception module configured to detect and identify a target in the surrounding environment from the radar data and to control the antenna module.

19. The radar system of claim 18, wherein the plurality of quadrature signals comprises a first signal at a first degree, a second signal at a second degree in quadrature with the first signal, a third signal at a third degree in quadrature with the second signal, and a fourth signal at a fourth degree in quadrature with the third signal.

* * * * *